United States Patent [19]

Dalglish

[11] Patent Number: 4,464,573

[45] Date of Patent: Aug. 7, 1984

[54] CHARGED PARTICLE BEAM FOCUSSING DEVICE

[75] Inventor: Robert L. Dalglish, Abbotsford, Australia

[73] Assignee: Unisearch Limited, Kensington, Australia

[21] Appl. No.: 355,696

[22] Filed: Mar. 8, 1982

[30] Foreign Application Priority Data

Mar. 9, 1981 [AU] Australia ............................... PE7909

[51] Int. Cl.$^3$ ....................... B23K 15/00; H01J 37/26; H05H 5/00
[52] U.S. Cl. .............................. 250/396 R; 250/492.3
[58] Field of Search .................... 250/396 R, 310, 311, 250/492.3

[56] References Cited

U.S. PATENT DOCUMENTS 3,569,757  3/1971  Brewer et al. ...................... 250/396
3,622,741  11/1971  Steigerwald ...................... 250/492.3

Primary Examiner—Alfred E. Smith
Assistant Examiner—T. N. Grigsby

[57] ABSTRACT

A charged particle beam focussing device in which a pair of rod like electrodes having a potential difference maintained between them are arranged on either side of the path of a beam to be focussed. The configuration of the electrodes is such that the significant electric field between them is confined to a short section of the path of the particles. A second pair of similar electrodes are arranged parallel to and in a plane substantially parallel to the plane of the first pair and displaced in a direction parallel to the plane in which the first pair lie, a potential difference being maintained between the second pair of electrodes. The arrangement is such that by variation of the potentials between the electrodes a beam of charged particles passing along the beam path between the electrodes can be caused to come to a focal line in a predetermined plane. A further device arranged at right angles to the first beam is provided to bring the beam to a point focus. The electrodes are preferably passed through earth reflector planes arranged on either side of the path of the beam.

3 Claims, 11 Drawing Figures

POTENTIAL SOURCE

CHARGED PARTICLE BEAM FOCUSSING DEVICE

The present invention relates to a charged particle focusing device and in particular although not exclusively to an ion beam focus forming system.

In the last few years there has been a growing interest in the use of ion microbeams for implantation and surface region analysis. This interest has generated research on and development of ion beam focus forming systems.

The most common lens system now being used is a magnetic quadrupole multiplet. This lens system uses as is object a small aperture illuminated by the beam, and "demagnifies" the object onto an image on the target. Other systems used involve electrostatic quadrupole multiplets and recently, solenoidal magnetic fields (8,10).

The theory and design of optical lens systems has brought optical instruments to a state of development where microscopes, telescopes, cameras etc. are limited only by diffraction effects. The same certainly cannot be said for charged particle lenses, although limitations other than diffraction effects such as phase space density invariance impose constraints on the performance of these lenses.

The best developed charged particle lenses are in electron microscopes, but even there the aperture must be greatly restricted to achieve the present resolution limit. Compared to the electron microscope lens systems, ion microbeam lenses seem rather poor.

For some time, work has been carried out on the development of this field and it has been postulated that the comparatively poor performance of ion beam lenses is due to the fact that the general techniques used in light optics for aberration correction have not been adequately applied to ion optics. This is obviously due to the limited availability of suitable lens configuration with negative power (9). In light optic systems, lensing elements of different powers (and dispersions) are combined to minimise or correct spherical, astigmatic and chromatic aberrations. With sufficient elements, all aberrations can be corrected simultaneously. The object of the present invention is to provide a focusing device which enables this to be achieved with charged particles.

The invention consists of a charged particle beam focusing device comprising a first pair of truncated electrodes between which a potential difference is maintained, the electrodes being arranged on either side of a path of the beam to be focussed, the configuration of the electrodes being such that the significant electric field between them is confined to a short section of the path, and a second pair of truncated linear electrodes parallel to and in a plane substantially parallel to the plane of the first pair and displaced in a direction parallel to the plane in which the first pair of electrodes lie, a potential difference being maintained between the second pair of electrodes, the arrangement being such that by variation of the potentials between the electrodes a beam of charged particles passing along the said beam path between the electrodes can be caused to come to a focal line in a predetermined plane. It is preferred to utilise a plurality of such focussing devices in series along the beam path to focus the beam to a point focus, at least one of the devices being arranged so that the electrodes thereof are at right angles to the first mentioned pairs of electrodes. It is further preferred to pass the electrodes through earth reflector planes arranged on either side of the path.

In order that the nature of the invention may be better understood a preferred form thereof is hereinafter described by way of example with reference to FIGS. 1 to 7 of the accompanying drawings in which.

Figure 5:
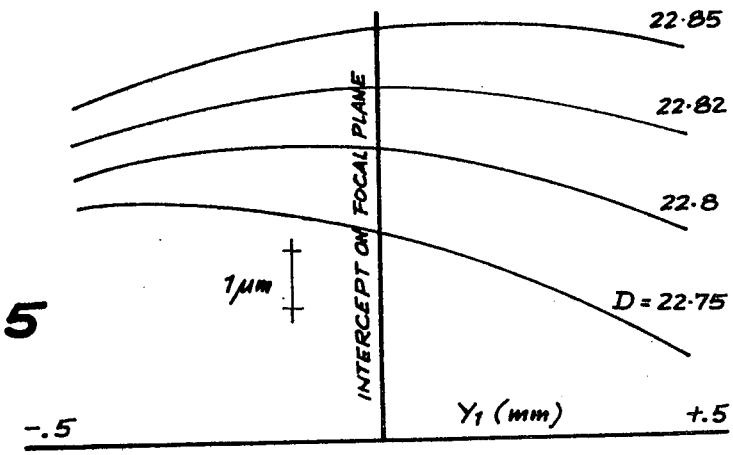
Figure 6:
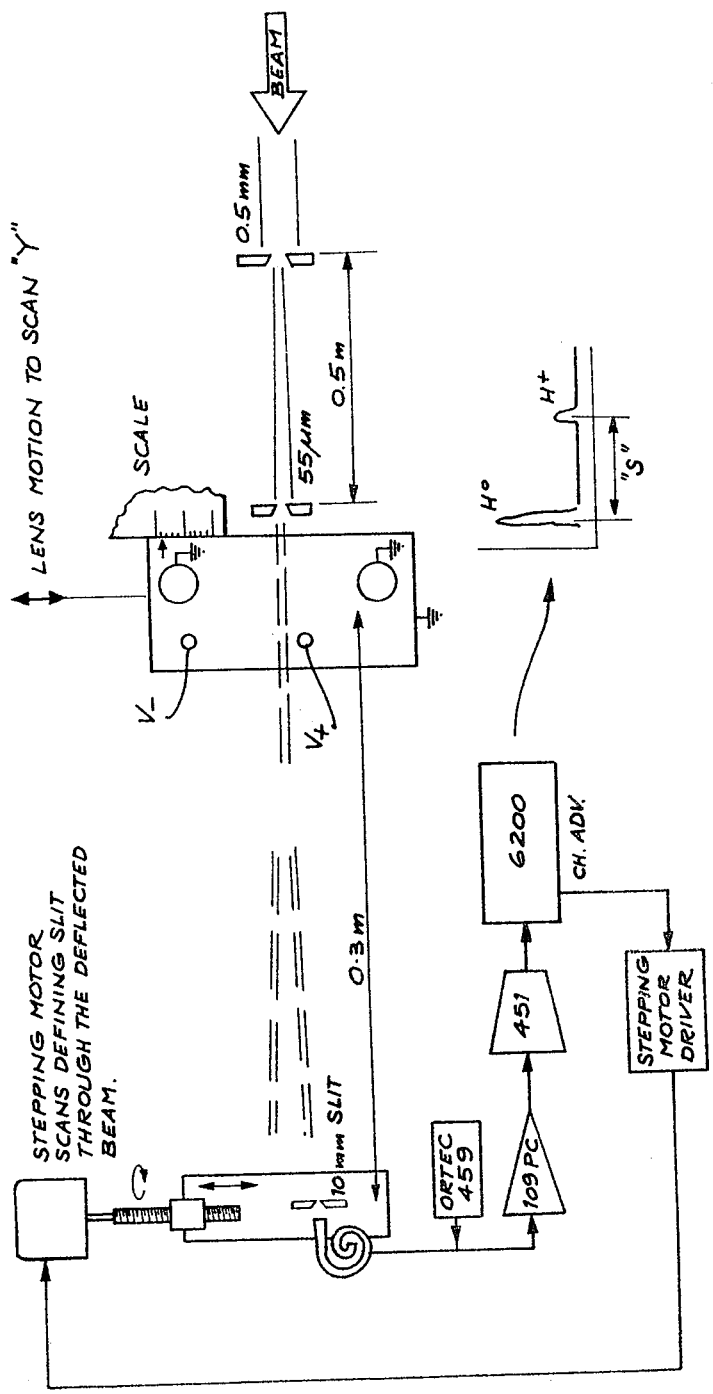
Figure 7:
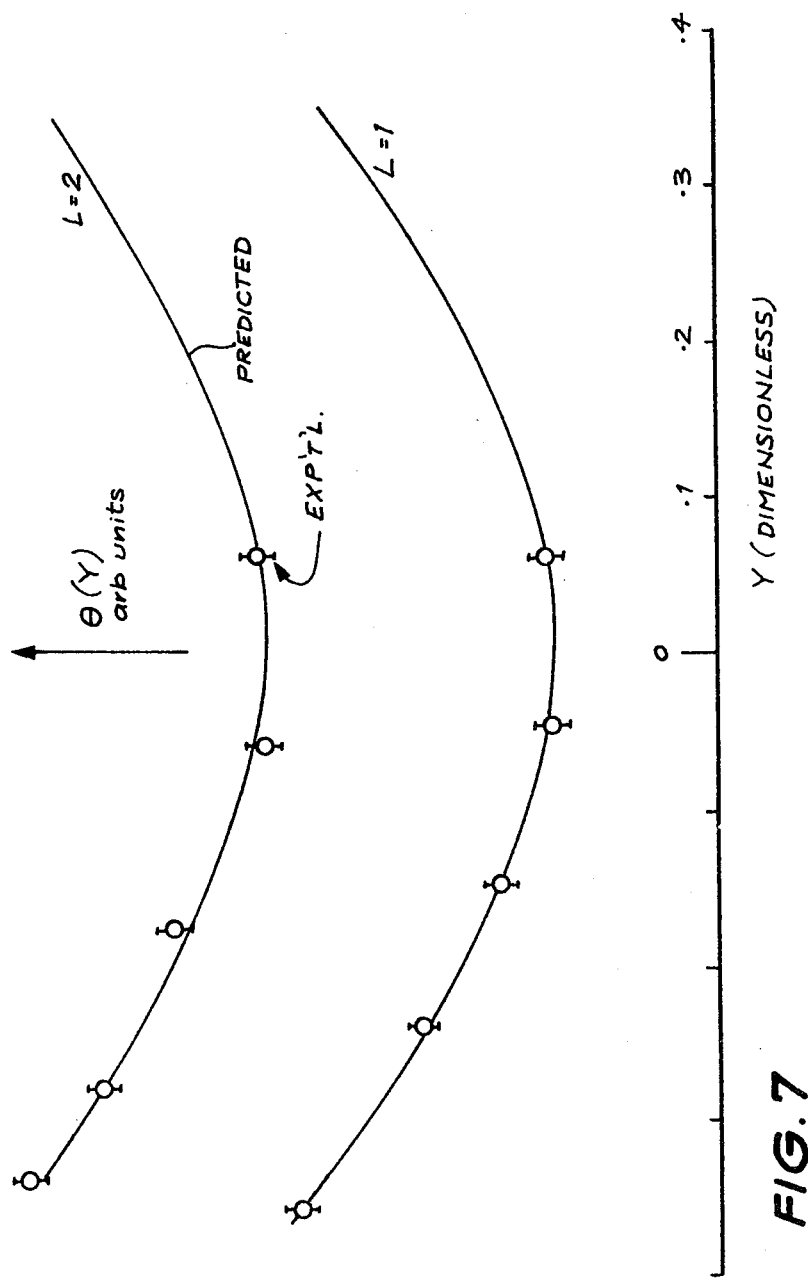

FIG. 5 illustrates a computer prediction of focus abberation of the focal plane for several planes. The curves are offset to show their shape clearly. For $D = 22.82$, the shape is almost parabolic, indicating that a further low power element should be able to improve the focus;

FIG. 6 illustrates an experimental setup to test the transfer characteristic of the transverse rod element in a Caledonian quadruplet configuration;

FIG. 7 depicts curves making a comparison between the scaled computer prediction (solid line) and the experimental observation (circles) for the cases $L = 1$ and $L = 2$.

Figure 8:
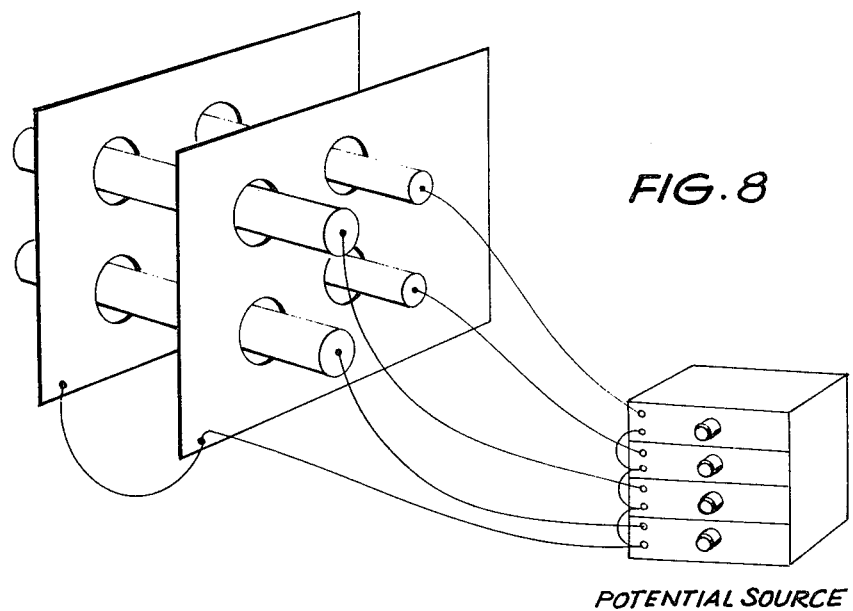

FIG. 8 is an illustration of two pairs of rod elements with ground planes; and

Figure 9:
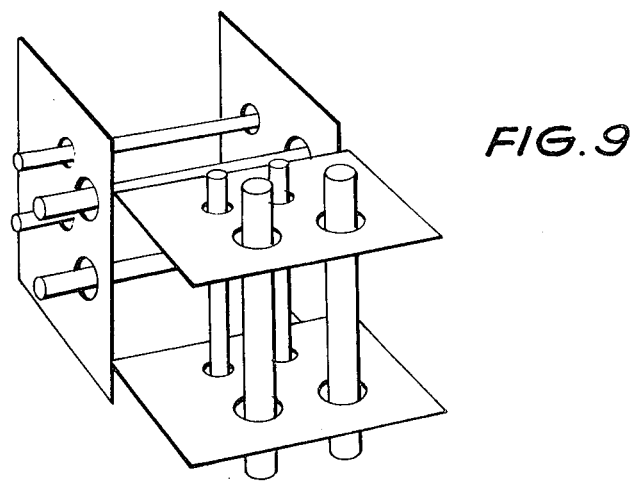

FIG. 9 is an illustration of two focussing devices arranged at right angles with respect to each other, and including rod elements and ground planes.

The principles underlying the present invention have been investigated in connection with a coaxial lens systems which, while producing a reasonable result is an unsuitable element. An investigation for a more suitable basic element was therefore carried out.

Figure 1:
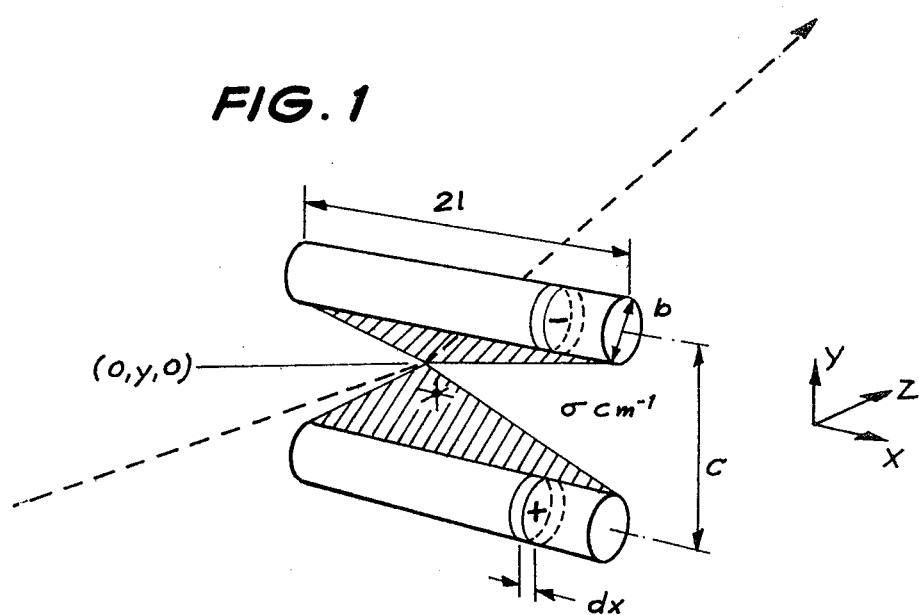
FIG. 1 is an illustration of a twin transverse rod configuration used to produce planar focussing.

Many elements were considered and to achieve the desired overall result, it was necessary to relax to one dimensional (planar) focussing. As will be shown shortly, this causes no problems for the final lens systems. The chosen element was the twin transverse rod configuration shown in FIG. 1. The xz plane is the symmetry plane of the element, the origin is at the element centre point.

Several simplifying assumptions can be made with this element to simplify mathematical analysis.

Since the lens potential is small compared with the beam accelerating potential and the effect of the lens on the ion path will be slight, and furthermore, since unlike the co-axial element, the deflecting field is fairly uniform normal to the beam's path, and impulse approximation for the trajectory is assumed.

To get a simple representation of the field in the deflecting region, the actual charge distribution on the rods is modelled by a uniform charge distribution. This is somewhat dubious, but the intention is to achieve a simple model for the element's behaviour. As will be shown, experimental results validate this assumption.

Using these two assumptions, the impulse experienced by a beam paticle traversing the lens can be easily derived by integrating first along the path in the z direction for a small element of charge dipole do+, do−, then by integrating over the entire charge distribution (i.e. over dx)

$$\underline{I} = \frac{\sigma q}{\pi \epsilon_0 V_z} \left[ \tan^{-1}\left(\frac{l}{\frac{c}{2}+y}\right) + \tan^{-1}\frac{l}{\frac{c}{2}-y} \right] \hat{y} \quad (8)$$

along the plane x=0.

The lens power is best expressed in terms of the applied potential difference $V_L$. For infinite cylinders the relationship between $V_L$ and $\sigma$ can be found:

$$\sigma = \frac{\pi \epsilon_0 V_L}{\cosh^{-1}\frac{c}{b}} \quad (9)$$

The particle velocity $v_z$ can be simply linked to the accelerating potential $V_s$:

$$V_s = \frac{m v_z^2}{2q} \quad (10)$$

From 5, 6, 7, the deflecting angle $$\theta\left(\frac{v_y}{v_z}\right)$$

of the ion can be simply shown to be:

$$\theta(y) = \frac{V_L}{V_s} \frac{1}{2\cosh^{-1}\frac{c}{b}} \left[ \tan^{-1}\left(\frac{l}{\frac{c}{2}+y}\right) + \tan^{-1}\left(\frac{l}{\frac{c}{2}-y}\right) \right] \quad (11)$$

and the deflection is proportional to the solid angle subtended by the lens element at the point (0,Y,0). If the charge density were uniform along the rod, this result can be shown to be valid for all trajectories through the element. It is reasonable to assume that for small distances away from the plane x=0, the small effect of the distorted charge distribution allows this result to be applied. The relationship between solid angle and deflection dictates the adoption of generalised co-ordinates scaled to the rod separation, c:

$$Y = \frac{y}{c}, X = \frac{x}{c}, L = \frac{l}{c} \text{ and } B = \frac{b}{c} \quad (12)$$

In these co-ordinates eqn. 11 becomes with trigometric manipulating:

$$\theta(Y) = A \tan^{-1}\left[\frac{L2}{\frac{1}{4} - Y^2 - L^2}\right] \quad (13)$$

a form suitable but tedious for expansion. It was found simpler to postulate a power series expansion for this "even" function $$\theta(Y) = A \, a_0 + a_2 Y^2 + a_4 Y^4 + a_0 Y^6 + \ldots \quad (14)$$

and to fit this series numerically to a tabulation of equation 13. The results are depicted in Table 1, where the power terms for various L parameters are shown.

TABLE I

| L | a₀ | a₂ | a₄ | a₆ |
|---|---|---|---|---|
| 0.55 | 3.333 | 3.610 | −0.814 | −2.320 |
| 0.75 | 3.932 | 2.274 | −1.122 | −0.056 |
| 1.0 | 4.418 | 1.280 | −0.618 | 0.132 |
| 1.25 | 4.762 | 0.760 | −0.304 | 0.082 |
| 1.5 | 4.998 | 0.480 | −0.154 | 0.036 |
| 1.75 | 5.170 | 0.318 | −0.082 | 0.016 |
| 2.0 | 5.304 | 0.222 | −0.044 | 0.008 |
|  | 6.283 | 0 | 0 | 0 |

Bearing in mind that in the lens element, the magnitude of Y must be less than ½ and in practice will be much smaller than this, the $a_4$ term and beyond can be ignored in first analysis of the element's behaviour. Thus, in the first analysis, the behaviour is considered to be given by $$\theta(Y) = A(a_0 + a_1 Y^2) \quad (15)$$

Figure 2A:
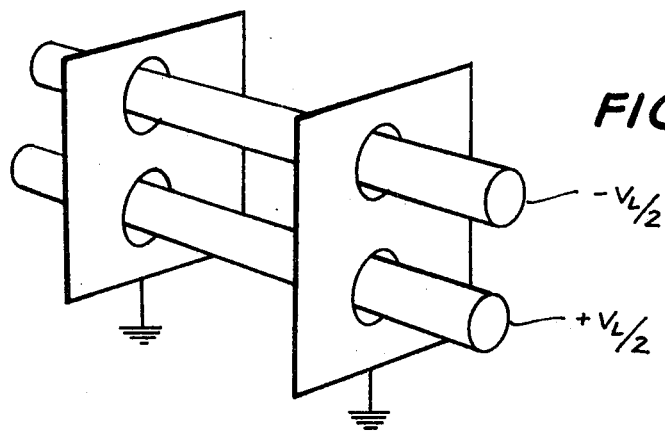
FIG. 2a is an illustration of a twin rod element with ground planes.
Figure 4:
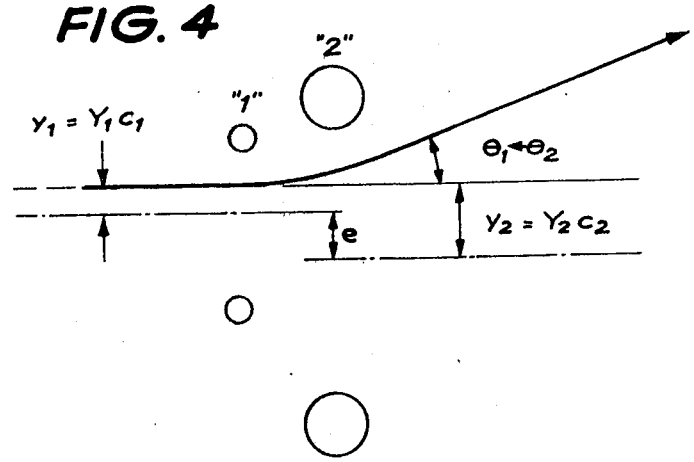
FIG. 4 illustrates the parameters for the displaced pairs of elements of, the Caledonian Quadruplet.

However, before going further into the analysis, consideration was given to the realistic form that such a lens must adopt. The truncated rods of FIG. 4 are not realistic, realisable form. There must be some means for connecting the potentials up to the rods and for mounting them. To allow for such things, it was decided to mount the rods through conducting grounded shields (FIGS. 2a, 8 and 9). These ground planes produce a series of alternate reflected images of the rods on both sides.

The result of eqn. (11) allows incorporation of impulses due to those reflected images, by numerically iterating over the solid angles subtended by the alternating images. This realistic element configuration was analysed in a computer and the behaviour was modelled as for eqn. (15) to extract the two parameters $a_0$ and $a_2$ as a function of L. The results are given in Table 2.

TABLE 2

| O = A (a₀ + a₂Y²) | | |
|---|---|---|
| L | a₀ | a₂ |
| 0.5 | .232 | 10.015 |
| 1.0 | 1.611 | 7.034 |
| 1.5 | 2.684 | 3.953 |
| 2.0 | 3.409 | 2.268 |
| 3.0 | 4.268 | 0.880 |
| 5.0 | 5.040 | 0.224 |

The pronounced effect of the reflector planes can be seen by comparing Table 1 and Table 2.

5. ABERRATION MINIMISATION

Figure 2B:
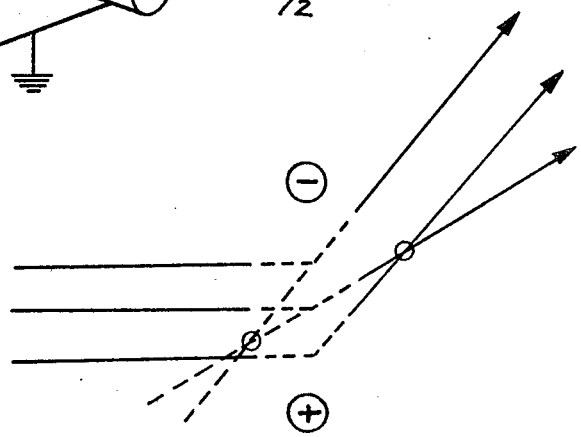
FIG. 2b is a series of curves showing the response of the element illustrated in FIG. 2a for an incident collimated beam for a range of geometric parameters L from 0.5 to 4.0, with constant B.
Figure 2C:
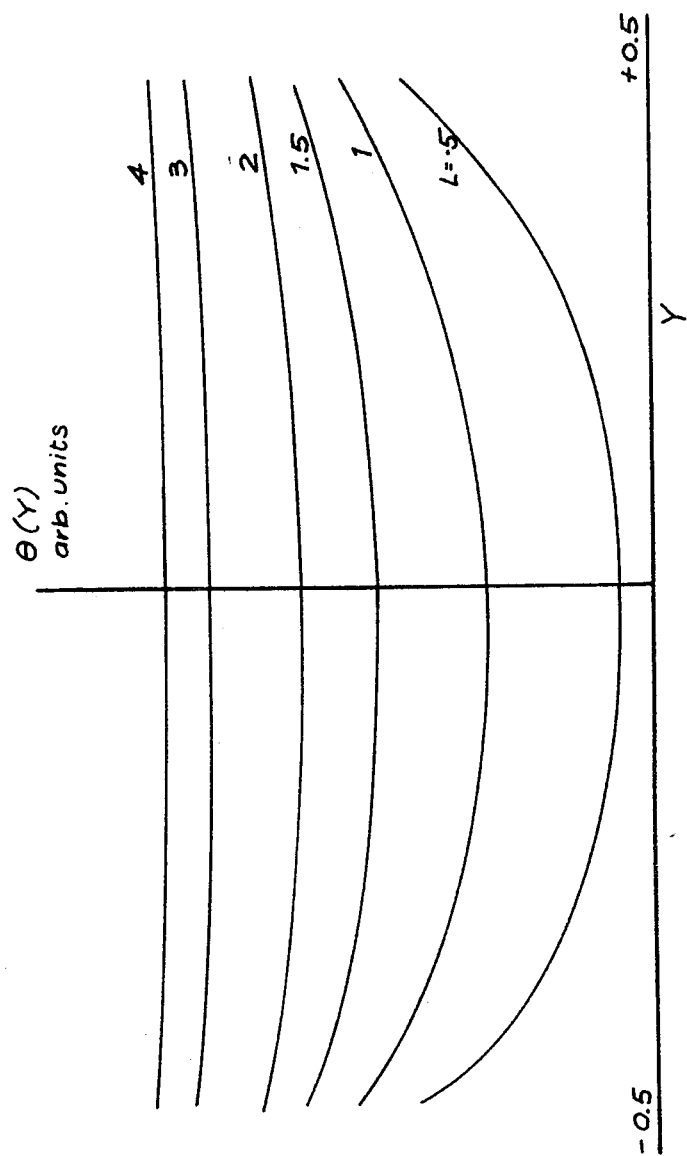
FIG. 2c is a diagrammatic representation of the trajectories of particles passing through the element.

The transform of a collimated beam passed through the lens is easily visualised from eqn. (15). FIG. 2b shows the computed family of such transforms for the real, ground plane reflector element discussed above. The resultant trajectories are depicted diagrammatically in FIG. 2c. There one can see that on one side of the symmetry plane the beam converges, on the other it diverges.

Figure 3:
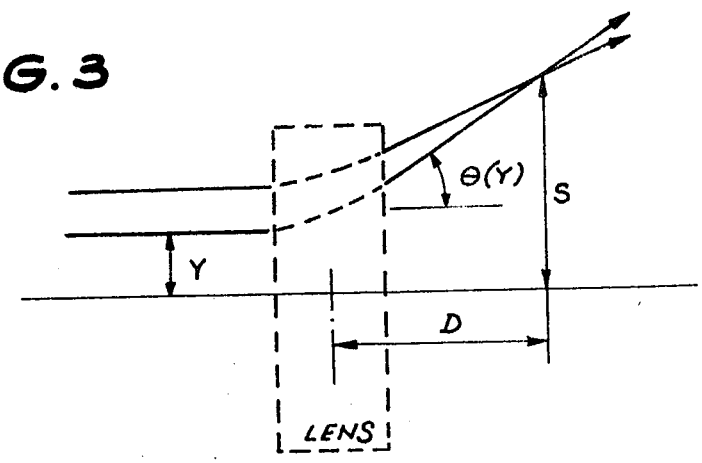
FIG. 3 illustrates the condition for a perfect focus at plane D, $S = Y + D \tan[\theta(Y)]$.

For an ideal lens, the form of $\theta(Y)$ is simply defined (FIG. 3).

$$S = Y + D \tan \theta(Y) \quad (16)$$

for small angles this yields.

$$\theta(Y) = (S/D) - (Y/D) \tag{17}$$

This relationship is not possible with the single element defined by eqn. (15).

But if a second offset element is added to the first (FIG. 4) and the two element pairs are considered to act independently, the following interesting result is achieved:

$$\theta = \theta_1 + \theta_2 = A_1(a_{01} + a_{21}Y_1^2) + A_2(a_{02} + a_{22}Y_2^2) \tag{18}$$

but $$Y_2 = \frac{Y_1 C_1 + e}{C_2} \tag{19}$$

If conditions are chosen such that:

$$A_1 a_{21} C_2^2 + A_2 a_{22} C_1^2 = 0 \tag{20}$$

then $$\theta(Y_1) = \left( A_1 a_{01} + A_2 a_{02} + \frac{a_{22} e^2}{C_2^2} \right) + (2 A_2 a_{22} C_1 e / C_2^2) Y_1 \tag{21}$$

which is in the ideal form for a precise focus. Thus the two term expansion eqn. (15) predicts an ideal lens in this configuration, which has been nicknamed the Caledonian Quadruplet. This ideal case however is aberrated by further power terms in the expansion of eqn. (15) (see eqn. 14), but the eqns. (20) and (21) were used to indicate the conditions for a "perfect" system. Choosing $V_L/V_S = 0.1$, $C_1 = 25$ mm, $C_2 = 50$ mm, $B_1 = B_2 = 4$, $L_1 = 2$, $e = 12.5$ mm, $L_2 = 1$ the focal plane is predicted at $D = 23$ with a voltage ratio $V_{L1}/V_{L2}$ of 0.781.

This predicted configuration was analysed by the iterative solid angle technique mentioned earlier to explore the effect of the higher order expansion terms on the focus quality. The best focus was found to occur at $D = 22.82$. FIG. 8 depicts the computer prediction of the beam focus. For an input beam of 1 mm depth, the entire beam is seen to be contained within 1 $\mu$m. Note that the "shape" of the focus is dominated by a $Y^2$ term, indicating that a further pair of rods could be used to "correct" the result.

The further power terms in the expansion (eqn. 14) can be analysed by the technique used in eqn. (18), to predict the optimum quadruplet, that is, with minimal coefficients of $Y^n$, $n > 1$.

Eqn. (21) shows that it is also possible to achieve a focus on the axis by making the constant term equal to zero. This however leads to a very weak lens. It can be shown that the geometric configuration can provide a sharp focus at only one median deflection angle, i.e. the lens cannot scan the beam across the sample. By adding another pair of rods to the system, it is expected that the resultant hexiplet will be able to raster a focus on the focal plane.

6. EXPERIMENTAL MEASUREMENTS

The analysis above indicates that the element forms a basis for a very effective lensing system. The many simplifying assumptions made in the analysis required some experimental verification. An experiment was therefore mounted on our newly built 200 kV ion implanter.

For a variety of reasons it was only possible at the time to mount the experiment near the accelerator and a long collimator was therefore not possible. Because of the poor collimation the beam was too divergent to test the aberration minimisation in the lens system, but it was possible to test the transfer characteristic of the element.

The experiment was set up as in FIG. 6. It involved passing a collimated beam through the quadruplet element and measuring the resultant deflection as a function of the input beam position. The collimated beam was measured by a Channel Electron Multiplier (CEM) mounted behind a 10 $\mu$m slit in a travelling mount. The mount was driven by a stepping motor. The data was collected by shaping and counting the CEM pulses in an ORTEC 6200 in MCS mode. Channel advance was generated by the time base and the channel advance pulse was used to advance the stepping motor. Motions of the detector over 2, 4, 8, 16 or 32 $\mu$m regions, could be made to correspond to each channel of the scaler.

The spectrum thus generated was a precise spatial contour of both neutral and charged components of the beam. The angular deflection of the ions could thus be precisely determined directly from the neutral component position. The angular deflection was precisely proportional to deflecting potential. The angular deflection as a function of beam entry position was easily found.

The element tested was the Caledonian Quadruplet configuration discussed above, but the corrector elements were grounded during the tests to include the imaging effect of the active element in the corrector element (thereby including the interaction and imaging of the charge distributions which would be present in the Quadruplet configuration). The presence of the second collimating slit near the lens shielded some of the ion path and gave a slight reduction from the predicted deflection. The predicted results scaled at $Y = 0$ and compared to the observed results are shown in FIG. 10 for $L = 1$ and $L = 2$ (the two parameters used in the lens design of Section 5 above). The shape of the two curves agrees very well and the result of eqn. (15) is confirmed within the scaler constant.

The aberration minimisation technique depends on the shape rather than the magnitude of the transfer function. At this stage therefore, it seems that the Caledonian Quadruplet will work as predicted.

The system is now being rebuilt on the long line of a Cockroft Walton ion accelerator where a 6 m collimator can be established. In this set up the full performance can be investigated. Further analysis and measurement of extra corrector stages will be carried out. Preliminary studies of the influence of the quadruplet on the beam away from the x plane has indicated that the effect there is very small for 1 mm diameter beams. The estimate made so far predicts deflections less than $10^{-3}$ of the principle deflections. If this is substantiated experimentally, two quadruplets at right angles will be able to produce good focussing in two dimensions and a high quality microprobe lens system will be achieved.

7. CONCLUSION

At this stage the Caledonian Quadruplet planar focussing lens described here looks very promising for the development of ion microbeams. The absence of a symmetry axis in the elements parallel to the beam avoids restrictions imposed by angular momentum considerations in lens elements with such an axis. The simple basic elements of the system has been shown to behave as predicted in a simple straight-forward analysis.

Further analysis based on this result predicts that a single corrector element added to the principal focussing element will bring a 1 mm collimated beam to a 1 $\mu$m focus. The analysis indicates that further correction is possible. The lensing effect at right angles to an element is so small that orthogonal elements should operate independently and should be able to bring a 1 mm diameter beam to a 1 $\mu$m diameter focus.

The lens system appears to be virtually anastigmatic so that it should be adequate for use as an imaging lens. The angular field is estimated to be of the order of 1°. This property of the lens system leads to the possibility of it being used in cascaded demagnification as a high power condenser, or for cascaded magnification as a microscope system.

In magnetic lens systems it is essential to stabilise both the accelerator voltage and the lens current independently to high precision.

In this lens system here, the action is entirely electrostatic and the focal point is determined by the ratio of accelerator to lens voltage. Therefore, if the lens is powered by a divider from the accelerator voltage, the requirement for stabilisation is greatly relaxed.

The results and predictions given above indicate an interesting new direction for the possible development of charged particle lens systems.

The form of the invention specifically described above, that is to say the Caledonian Quadruplet planar focussing lens constitutes a preferred embodiment of the invention within the scope of the invention as defined broadly above.

REFERENCES

1. Krejcik, P. and Dalglish, R. L. A low aberration MeV proton microprobe. Proceedings Aust. Conf. on Nucl. Techn. of Analysis, Sydney (1976).
2. Krejcik, P. Dalglish, R .L. and Kelly, J. C. An electrostatic coaxial probe forming lens suitable for high energy ion beams. J. Phys. D. 12, pp. 161–7 (1979).
3. Krejcik, P., Kelly, J. C. and Dalglish, R. L. A new electrostatic ion microprobe system. Nucl. Inst. Meth. 168, 247–9 (1980). (Proceedings of 4th Int. Conf. on Ion Beam Anal., Aarhus 1979.)
4. Liebl, H. An electrostatic radial field doublet lens. Optik, 53, 333–8 (1979).
5. Krejcik, P., King, B. V. and Kelly, J. C. An analysis of some solution techniques for electrostatic co-axial lenses. Optik, 4 (1980), 385–393.
6. Krejcik, P. The focussing of GeV particles with electrostatic co-axial lenses. NIM 171, (1980) 233–6.
7. Krejcik, P. A high resolution ion beam for implantation and nuclear analysis. Ph. D. Thesis U. N.S.W. (1980)
8. Cookson, J. A., Nucl. Inst. Meth. 165, 477 (1979).
9. Gabor, D. A zonally corrected electron lens. Nature, 158, 198 (1946).
10. Cookson, J. A. The use of PIXE techniques with nuclear microprobes. Nucl. Inst. Meth. (in print 1980).

I claim:
1. A charged particle beam focussing device comprising a first pair of truncated linear electrodes to which potential differences are maintained with respect to a ground plane, the electrodes being arranged on either side of a path of the beam to be focussed, the configuration of the electrodes being such that the significant electric field between them is confined to a short section of the path, and a second pair of truncated electrodes parallel to and in a plane substantially parallel to the plane of the first pair and displaced in a direction parallel to the plane in which the first pair of electrodes lie, potential differences with respect to the ground plane being maintained on each of the second pair of electrodes, the arrangement being such that by variation of the potentials between the electrodes a beam of charged particles passing along the said beam path between the electrodes can be caused to come to a focal line in a predetermined plane.

2. A charged particle beam focussing device comprising a plurality of focussing devices as claimed in claim 1 arranged in series along the beam path and rotated at different angles about the beam axis to focus the beam to a point focus.

3. A charged particle beam focussing device as claimed in claim 1 or claim 2 wherein the electrodes are passed through earth reflector planes arranged on either side of the path.

* * * * *